(12) United States Patent
Chen

(10) Patent No.: US 8,068,708 B2
(45) Date of Patent: Nov. 29, 2011

(54) LARGE TOLERANCE FIBER OPTIC TRANSMITTER AND RECEIVER

(75) Inventor: Ye Chen, San Jose, CA (US)

(73) Assignee: Avago Technologies Fiber IP (Singapore) Pte. Ltd, Singapore (SG)

( * ) Notice: Subject to any disclaimer, the term of this patent is extended or adjusted under 35 U.S.C. 154(b) by 20 days.

(21) Appl. No.: 12/328,112

(22) Filed: Dec. 4, 2008

(65) Prior Publication Data

US 2009/0116784 A1    May 7, 2009

Related U.S. Application Data

(62) Division of application No. 10/795,064, filed on Mar. 5, 2004, now Pat. No. 7,488,117.

(51) Int. Cl.
    *G02B 6/32*      (2006.01)
(52) U.S. Cl. .............. 385/33; 385/31; 385/93
(58) Field of Classification Search .......... 385/31, 385/33, 35, 88, 91, 93
See application file for complete search history.

(56) References Cited

U.S. PATENT DOCUMENTS

| | | | |
|---|---|---|---|
| 4,501,637 A | 2/1985 | Mitchell et al. | |
| 4,616,899 A | 10/1986 | Schlafer | |
| 4,740,259 A | 4/1988 | Heinen | |
| 5,311,611 A | 5/1994 | Migliaccio | |
| 5,388,171 A | 2/1995 | Michikoshi et al. | |
| 5,500,540 A | 3/1996 | Jewell et al. | |
| 5,940,564 A | 8/1999 | Jewell | |
| 6,253,004 B1 | 6/2001 | Lee et al. | |
| 6,542,672 B2 | 4/2003 | Jewell et al. | |
| 6,658,040 B1 | 12/2003 | Hu et al. | |
| 6,661,951 B1 | 12/2003 | Blair et al. | |
| 6,670,105 B2 | 12/2003 | Terada et al. | |
| 6,953,990 B2 | 10/2005 | Gallup et al. | |
| 6,955,934 B2 | 10/2005 | Gallup et al. | |
| 6,998,691 B2 | 2/2006 | Baugh et al. | |
| 7,027,694 B2 | 4/2006 | Wang et al. | |
| 7,643,719 B1 * | 1/2010 | Zhou et al. .................... 385/131 |
| 2002/0088988 A1 | 7/2002 | Silverbrook | |
| 2002/0176468 A1 | 11/2002 | Kaneko | |
| 2003/0123779 A1* | 7/2003 | Hashimoto ..................... 385/14 |
| 2004/0001166 A1 | 1/2004 | Nimura et al. | |

(Continued)

FOREIGN PATENT DOCUMENTS

DE     10150401     5/2002

OTHER PUBLICATIONS

C, David "Fabrication of Stair-Case Profiles With High Aspect Ratios for Blazed Diffractive Optical Elements", *Microelectronic Engineering* 53, (2000),677-680.

Gale, Michael T., "Replicated Diffractive Optics and Micro-Optics", *Optics & Photonics News*, (Aug. 2003),24-29.

(Continued)

*Primary Examiner* — Charlie Peng
*Assistant Examiner* — Mary El Shammaa

(57) ABSTRACT

An optical transmitter relaxes the tolerance between a source assembly and a fiber receptacle to facilitate passive alignment. The source assembly includes a light source and a lens. The lens is held at a fixed distance away from the light source using precise support structures typically formed by photolithographic processes. The fiber receptacle includes an optical element. The fiber receptacle is adapted to hold an optical fiber at a fixed distance from the optical element. The lens substantially collimates light from the light source into the form of collimated light. The optical element focuses the collimated light onto the aperture of the optical fiber.

4 Claims, 3 Drawing Sheets

U.S. PATENT DOCUMENTS

| | | |
|---|---|---|
| 2004/0008917 A1 | 1/2004 | Zetterlund |
| 2005/0098790 A1 | 5/2005 | Gallup et al. |
| 2006/0039655 A1 | 2/2006 | Wilson |
| 2008/0099908 A1* | 5/2008 | Wang et al. .................. 257/704 |
| 2008/0100822 A1 | 5/2008 | Munro |

OTHER PUBLICATIONS

Karlsson, M. et al., "Monolithic Integration of Continuous-Relief Diffractive Structures With Vertical-Cavity Surface-Emitting Lasers", *IEEE Photonics Technology Letters* vol. 15, No. 3, (Mar. 2003),359-361.

* cited by examiner

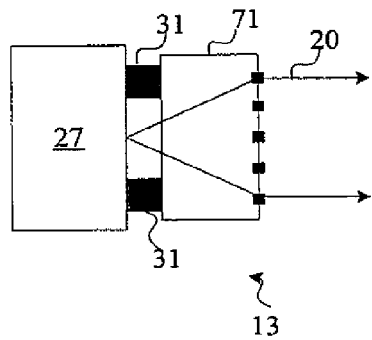
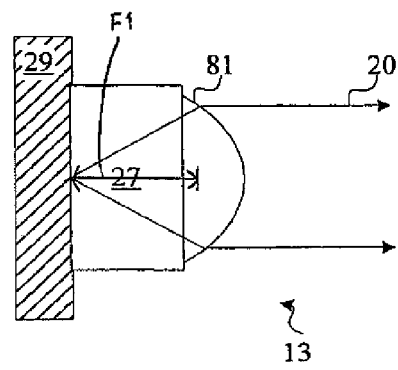
Figure 5         Figure 6
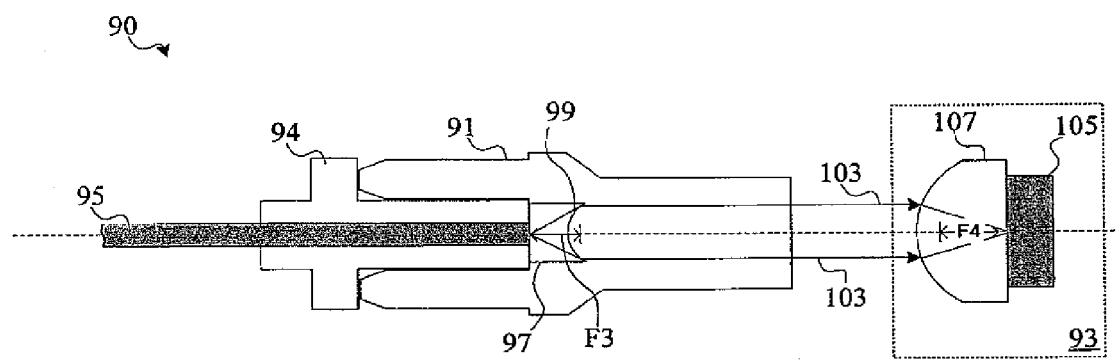
Figure 7

LARGE TOLERANCE FIBER OPTIC TRANSMITTER AND RECEIVER

This is a Divisional of application Ser. No. 10/795,064, filed Mar. 5, 2004, the disclosure of which is incorporated herein in its entirety by this reference.

This patent document is related to and hereby incorporates by reference the following co-filed U.S. patent application Ser. No. 10/794,252, entitled "VCSEL with Integrated Lens".

BACKGROUND OF THE INVENTION

In a fiber optic system, a light source emits light pulses that travel through optical fibers to transmit data. The light source and the optical fiber must be accurately aligned to maximize the coupling efficiency. The coupling efficiency is a measurement of how much light transmitted by the light source is actually received by the optical fiber.

One of the methods used to achieve alignment between the light source and the optical fiber is known as active alignment. In active alignment, the light source is turned on while its aperture is aligned to the receiving end of the optical fiber. The light source and receiving end of the optical fiber are adjusted while the transmitting end of the optical fiber is monitored by a light detector. The light detector measures the amount of light passing through the optical fiber. When the light received is at its maximum, the light source and the optical fiber are at an optimal alignment, at which point the optical fiber and light source are fixed into place.

Active alignment is time consuming and therefore expensive. Thus, it is desirable to produce components that can be aligned in assembly without turning on the light source or using a light detector. Such a process is known as passive alignment.

Passive alignment has its own drawbacks. The apertures of the light source and the optical fibers are very small, and the focal lengths of the lenses impose their own strict requirements on the location of each component. For example, FIG. 1 shows a prior art optical system 51. The prior art optical system 51 includes a light source 53, coupling optics 55, and an optical fiber 57. In conventional optical transmitters, the coupling optics 55 is a single unit having a first lens surface 59 and a second lens surface 61. The first lens surface 59 has a focal length of F1. The second lens surface 61 has a focal length of F2. The coupling optics 55 receives light from the light source 53 and focuses it onto the optical fiber 57. To achieve this, the optical axis of the light source 53 must be aligned with the optical axis of the first lens surface 59, and the optical axis of the second lens surface 61 must be aligned with the optical axis of the optical fiber 57. Furthermore, the light source 53 must be at a distance F1 from the first lens surface 59. Finally, the optical fiber 57 must also be at a distance F2 from the second lens surface 61.

The requirements of prior art optical system 51 leave very little tolerance during passive alignment. Consequently, expensive precision instruments are required to carefully measure, position, and place each component such that the light from the light source will be focused exactly on the target aperture of an optical fiber. Therefore, it is desirable to produce components that have greater tolerance so that passive alignment can be achieved with greater ease.

SUMMARY OF THE INVENTION

In a preferred embodiment, the present invention provides an optical transmitter with relaxed tolerances to facilitate passive alignment. The optical transmitter includes a source assembly and a fiber receptacle. The source assembly includes a light source and a lens. The lens is held at a fixed distance away from the light source using precise support structures typically formed by photolithographic processes. The fiber receptacle includes an optical element. The fiber receptacle is adapted to hold an optical fiber at a fixed distance from the optical element. The lens substantially collimates light from the light source into the form of collimated light. The optical element focuses the collimated light onto the aperture of the optical fiber.

This arrangement relaxes the tolerance between the source assembly and the fiber receptacle because a collimated beam produces a stable coupling efficiency throughout a substantial range of misalignment between the source assembly and the fiber receptacle.

Another embodiment of the present invention provides relaxed tolerances for passive alignment of an optical receiver. The optical receiver includes a fiber receptacle and a detector assembly. The fiber receptacle includes an optical element. The fiber receptacle is adapted to hold an optical fiber at a fixed distance from the optical element. The optical element substantially collimates light from the optical fiber into the form of collimated light. The detector assembly includes a lens and a light detector. The lens is held at a fixed distance away from the light detector using precise support structures typically formed by photolithographic processes. The lens focuses the collimated light onto the light detector.

Further features and advantages of the present invention, as well as the structure and operation of preferred embodiments of the present invention, are described in detail below with reference to the accompanying exemplary drawings. In the drawings, like reference numbers indicate identical or functionally similar elements.

BRIEF DESCRIPTION OF THE DRAWINGS

FIG. 5 shows an alternate embodiment for the source assembly.

FIG. 6 shows an alternate embodiment for the source assembly.

FIG. 7 shows an optical receiver.

DETAILED DESCRIPTION

Figure 1:
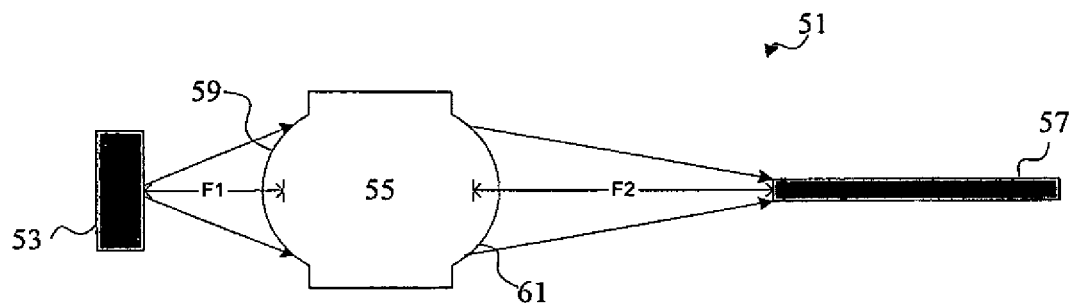
FIG. 1 shows a prior art optical system.
Figure 2:
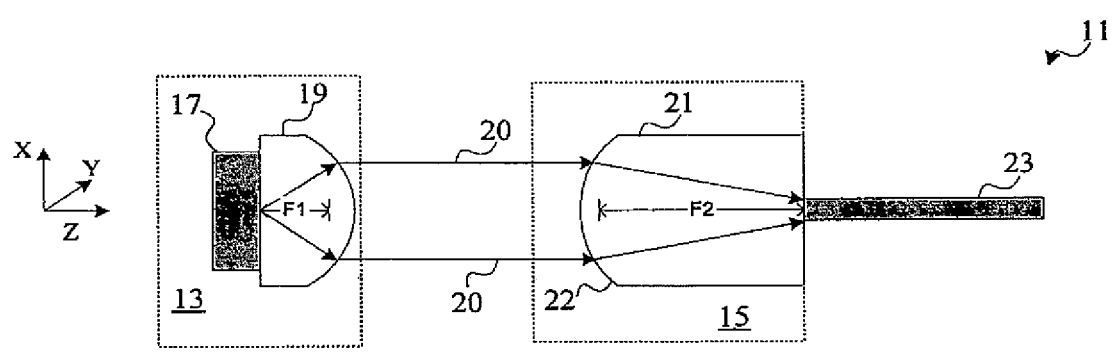
FIG. 2 shows a high level diagram of a preferred embodiment made in accordance with the teachings of the present invention.

FIG. 2 shows a high level diagram of a preferred embodiment made in accordance with the teachings of the present invention. An optical transmitter 11 includes a source assembly 13 and a fiber receptacle 15. The source assembly 13 includes a light source 17 and a lens 19. The lens 19 has a focal length F1. Although lens 19 is shown as a single component, it should be understood that multiple lenses or lens systems could be used. Using precise support structures to be disclosed below in further detail, the lens 19 is fixed at a distance F1 away from the light source 17, putting the light source 17 at the focal point of the first lens 19. Light emitted by the light source 17 is substantially collimated by the lens 19 and emerges as collimated light 20. In some applications, collimated light 20 may slightly deviate from being perfectly collimated to achieve optimal system performance.

The fiber receptacle 15 includes an optical element 21. The fiber receptacle 15 is adapted for coupling to an optical fiber 23. The optical element 21 has a focusing surface 22 that focuses collimated light 20 from the light source onto the aperture of the optical fiber 23. The optical element 21 has a focal length F2. Although optical element 21 is shown as a single component, it should be understood that multiple optical elements or systems of optical elements could be used. The optical element 21 is fixed by the fiber receptacle 15 at a distance F2 away from the optical fiber 23, putting the optical fiber 23 at the focal point of the optical element 21.

The source assembly 13 and the fiber receptacle 15 are aligned upon a Z-axis, which coincides with the axis of light propagation. The X- and Y-axis define a plane perpendicular to the Z-axis.

The present invention relaxes the tolerance between the source assembly 13 and the fiber receptacle 15 by tightening the alignment within the source assembly 13 itself. The light source 17 is precisely aligned to the focal point of the lens 19 within source assembly 13, typically by using a support structure formed by photolithographic processes to position the lens 19. The fiber receptacle 15 is also designed to align the optical fiber 23 to the focal point of the optical element 21. Since the distances for the focal lengths of the lens 19 and the optical element 21 are already fixed, the distance between the source assembly 13 and the fiber receptacle 15 along the Z-axis is not as critical.

The tolerance between the source assembly 13 and the fiber receptacle 15 is further relaxed by collimating the light between the source assembly 13 and the fiber receptacle 15. Since the light is collimated (into collimated light 20), the alignment of the source assembly 13 to the fiber receptacle 15 within the XY-plane is not as critical, either. If the alignment is slightly off, only a small amount of light is lost.

Figure 3A:
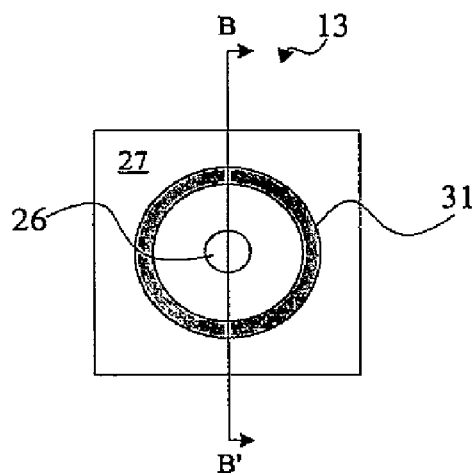
FIGS. 3A and 3B show a source assembly.
Figure 3B:
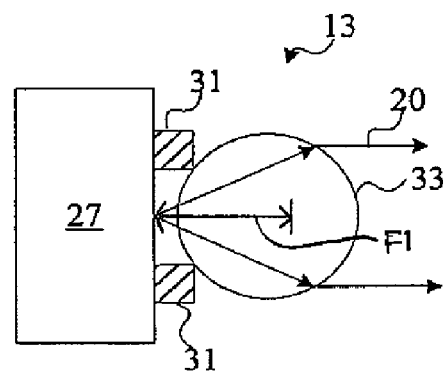

FIGS. 3A and 3B show a preferred embodiment of the source assembly 13. FIG. 3A is a top view and FIG. 3B is a cross-sectional view taken along the line B-B' of FIG. 3A. The light source in the preferred embodiment is a vertical cavity surface emitting laser (VCSEL) 26, although other light sources, such as edge-emitting diodes and other lasers, may also be utilized. The VCSEL 26 is formed on a VCSEL substrate 27 using standard VCSEL manufacturing techniques. The VCSEL substrate 27 is formed from any suitable semiconductor material. A standoff 31 supports a ball lens 33 (not shown in FIG. 3A) in front of the light-emitting surface of VCSEL 26. The standoff 31 is formed upon the VCSEL substrate 27 using standard photolithographic materials and methods. The formation of standoff 31 and the attachment of the ball lens 33 are described in co-filed U.S. patent application Ser. No. 10/794,252, entitled "VCSEL with Integrated Lens". The standoff 31 positions the ball lens 33 such that the VCSEL 26 aperture is located at the focal point of the ball lens 33. The ball lens 33 may be spherical in shape. Since the VCSEL 26 is positioned at the focal point of the ball lens 33, any light emitted from the VCSEL 26 and passing through the ball lens 33 emerges as collimated light 20.

Due to the precise nature of photolithographic methods, the standoff 31 can be fabricated within a tight tolerance to achieve accurate positioning in the XY plane as well as the Z-direction. For example, current photolithographic methods are accurate to within 2-3 micrometers. As a result, the VCSEL 26 can be closely aligned to the focal point of the ball lens 33. In an actual working embodiment, standard photolithographic processes were used to deposit polyimide onto the surface of the VCSEL 26 and etch the polyimide into a ring shape, creating the standoff 31 for supporting the ball lens 33. The standoff 31 is not limited to the shape of a ring—a wide variety of shapes are acceptable for supporting the ball lens 33. Further, a wide variety of other materials and methods are available and may be used to create the standoffs 31.

Figure 4:
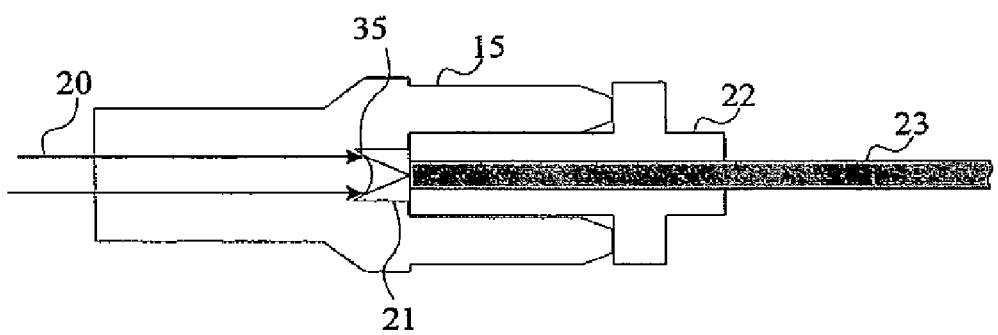
FIG. 4 shows a fiber receptacle and a fiber connector.

FIG. 4 illustrates a preferred embodiment of the fiber receptacle 15, shown in a cross-sectional diagram. The fiber receptacle 15 includes an optical element 21. The optical element 21 is typically a component that has the functionality of an optical lens (such as lens surface 35). The optical element 21 is formed from plastic, glass or any other suitable optical grade material. The fiber receptacle 15 is mechanically adapted to hold a fiber connector 22 on an optical fiber 23 with a relatively tight tolerance. There are many kinds of standardized fiber connectors, such as FC, SC, ST, LC, MT-RJ and MTP connectors, any of which would be suitable for use. The mechanical adaptation may be an interlocking mechanism on fiber receptacle 15 for latching onto or mating to the fiber connector 22. The optical fiber 23 is held at a fixed distance from the lens surface 35, such that the aperture of the optical fiber 23 is located at the focal point of the lens surface 35 when the fiber connector 22 is mated to the fiber receptacle 15. Collimated light 20 that passes through the lens surface 35 is focused onto the optical fiber 23. Although the fiber receptacle 15 is shown with a straight body for light propagation along a straight path, it is possible to manufacture the fiber receptacle 15 with one or more turns and reflecting surfaces so as to bend the light 20 in the desired directions. The fiber may also be directly attached to the light source with adhesive during the assembly process, such as in a pigtailed transceiver design.

FIG. 5 illustrates an alternate embodiment for the source assembly 13, shown in diagrammatic form. Here, a lens 71 is suspended over the VCSEL 26 by the standoff 31. Lens 71 can be a diffractive or a refractive lens. Again, since the standoff 31 is formed using photolithographic techniques, the lens 71 can be positioned with great precision such that the VCSEL 26 is positioned at the focal point of the lens 71, collimating the light from the light source. The formation of standoff 31 and the lens 71 are described in co-filed U.S. patent application Ser. No. 10/794,252, entitled "VCSEL with Integrated Lens".

FIG. 6 illustrates a second alternate embodiment for the source assembly 13, shown in diagrammatic form. The VCSEL shown here is a bottom-emitting VCSEL that can be flip-chip bonded to a header 29. The header 29 can be a printed circuit board or another semiconductor substrate. The header 29 may include auxiliary circuitry such as a driver for the VCSEL. No standoff or supporting structure is required in this embodiment because a lens 81 is formed directly on the surface of a VCSEL substrate 29. Lens 81 is formed using photolithographic processes. Typically, a layer of photopolymer is deposited onto the surface of the substrate 29. The photopolymer is etched to create the desired shape of the lens 81. The lens 81 can be formed directly from the substrate material as well, by performing an additional etching process to etch the shape of the lens into the VCSEL substrate 27 itself.

FIG. 7 illustrates an alternate embodiment for an optical receiver 90 in an optical system, shown in diagrammatic form. The optical receiver 90 includes a fiber receptacle 91 and a detector assembly 93. The fiber receptacle 91 includes an optical element 97 that is typically a component that has the functionality of an optical lens, such as lens surface 99. The lens surface 99 has a focal length of F3. The optical element 97 is formed from plastic, glass or any other suitable optical grade material. Although the fiber receptacle 91 is shown with a straight path for light propagation, it is possible to manufacture fiber receptacle 91 with one or more turns and reflecting surfaces so as to bend the light in the direction desired.

The fiber receptacle 91 is mechanically adapted to hold a fiber connector 94 on an optical fiber 95 with a relatively tight tolerance. The mechanical adaptation may be an interlocking mechanism on the fiber receptacle 91 for latching onto or mating to a fiber connector 94. The optical fiber 95 is held at a fixed distance F3 away from the lens surface 99, such that the aperture of the optical fiber 95 is located at the focal point of the lens surface 99. Light emitting from the optical fiber 95 is collimated by the lens surface 99 and emerges as collimated light 103.

The detector assembly 93 includes a light detector 105 and a lens 107. The lens 107 has a focal length of F4. The lens 107 is fixed at a distance F4 away from the light detector 105, putting the light detector 105 at the focal point of the lens 107. The lens 107 is precisely positioned using photolithographic processes. Collimated light 103 that passes through the lens 107 is focused onto the light detector 105.

Any of the source assemblies shown in FIG. 3, 5, or 6 can also be used as the detector assembly 93 by replacing the VCSEL 27 with a light detector 105. The light detector 105 can be a photodiode, a phototransistor, or any other device that is responsive to incident light. The detector assembly 93 enables high speed applications, since the active area of detector 105 can be very small in this application, on the order of 10-30 micrometers in diameter.

The disclosed embodiments of the present invention can also be easily adapted to parallel optic applications. In an alternate embodiment for a parallel transmitter, a source assembly includes an array of light sources producing a light array, and an array of lenses positioned over the array of light sources to collimate the light array. A fiber receptacle includes an array of optical elements for receiving the collimated light array. The array of light sources may all be formed on a single die, but this results in a lower manufacturing yield since a larger die has a greater probability of having a defect. Manufacturing yields are improved by separating the light sources into separate dies that are subsequently packaged into an array.

In the prior art conventional designs, the parallel sources were subject to tight tolerances because it was difficult to align an array of light sources with an array of lenses. The present invention relaxes these tolerances because each light source can be individually formed with its own integrated lens, thus foregoing the alignment of a light source array to a lens array altogether.

In an alternate embodiment for a parallel receiver, a fiber receptacle includes an array of optical elements for collimating an array of light from an array of optical fibers. A detector assembly includes an array of light detectors, and an array of lenses positioned over the array of light detectors to receive and focus the collimated light array. The array of light detectors may be formed on a single die, or the light detectors may be separated into separate dies and subsequently packaged into an array.

Although the present invention has been described in detail with reference to particular preferred embodiments, persons possessing ordinary skill in the art to which this invention pertains will appreciate that various modifications and enhancements may be made without departing from the spirit and scope of the claims that follow.

I claim:

1. An optical coupling system, comprising:
   a substrate including semiconductor material, the substrate having a top and a bottom;
   a light source formed in and unitary with the bottom of the substrate;
   a lens photolithographically formed on and unitary with the top of the substrate and over the light source, for collimating light from the light source into substantially collimated light;
   an optical lens element positioned for receiving the substantially collimated light from the lens and focusing the substantially collimated light; and
   a fiber receptacle adapted to hold the optical lens element and an optical fiber at a fixed distance apart, such that the optical lens element focuses the substantially collimated light onto an aperture of the optical fiber.

2. An optical coupling system as in claim 1, wherein the optical lens element includes a lens surface, the lens surface having a focal length.

3. An optical coupling system as in claim 2, wherein the fixed distance is substantially equal to the focal length of the lens surface.

4. An optical coupling system as in claim 3, wherein the light source is a vertical cavity surface emitting laser (VCSEL).

* * * * *